(12) United States Patent
Umeda et al.

(10) Patent No.: US 6,730,948 B2
(45) Date of Patent: May 4, 2004

(54) SEMICONDUCTOR DEVICE INCLUDING ACRYLIC RESIN LAYER

(75) Inventors: Kazuo Umeda, Shiki-gun (JP); Keiichi Matsunaga, Settsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/968,941

(22) Filed: Oct. 3, 2001

(65) Prior Publication Data

US 2002/0167032 A1 Nov. 14, 2002

(30) Foreign Application Priority Data

May 11, 2001 (JP) .......................... 2001-141991

(51) Int. Cl.[7] .................. H01C 29/76; H01C 29/94; H01C 31/062; H01C 31/113; H01C 31/119
(52) U.S. Cl. .................. 257/295; 257/301; 257/303; 257/306; 257/310
(58) Field of Search ................... 257/295–310

(56) References Cited

U.S. PATENT DOCUMENTS

| 4,925,772 | A |   | 5/1990  | Quella et al. |
| 5,514,888 | A |   | 5/1996  | Sano et al. |
| 5,581,384 | A | * | 12/1996 | Hotta et al. .................. 349/155 |
| 5,654,567 | A | * | 8/1997  | Numata et al. ............. 257/306 |
| 6,190,926 | B1 |  | 2/2001  | Perino et al. |
| 6,252,297 | B1 | * | 6/2001  | Kemmochi et al. ......... 257/640 |
| 6,316,798 | B1 | * | 11/2001 | Ogata et al. ................ 257/295 |
| 6,441,416 | B1 | * | 8/2002  | Tanaka et al. .............. 257/295 |
| 6,499,216 | B1 | * | 12/2002 | Fjelstad ....................... 29/842 |
| 6,524,896 | B1 | * | 2/2003  | Yamazaki et al. .......... 438/149 |
| 2003/0052336 | A1 | * | 3/2003 | Yamazaki et al. .......... 257/200 |

FOREIGN PATENT DOCUMENTS

| EP | 1 006 581    | 6/2000  |
| JP | 60-161639    | 8/1985  |
| JP | 03-006278    | 1/1991  |
| JP | 03-246937    | 11/1991 |
| JP | 10-270611    | 10/1998 |
| JP | 2000-68463   | 3/2000  |

* cited by examiner

Primary Examiner—Jerome Jackson
Assistant Examiner—Jesse A. Fenty
(74) Attorney, Agent, or Firm—Nixon Peabody LLP; Donald R. Studebaker

(57) ABSTRACT

A semiconductor device includes at least a ferroelectric or high-dielectric-constant film and a surface coating that have been stacked in this order over a substrate. The surface coating is made of an acrylic resin.

15 Claims, 8 Drawing Sheets

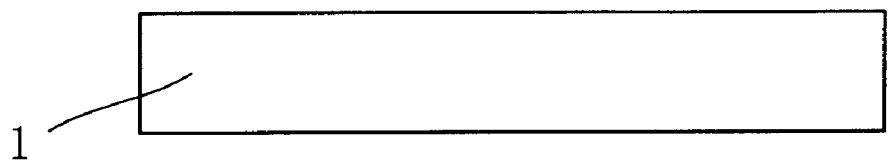
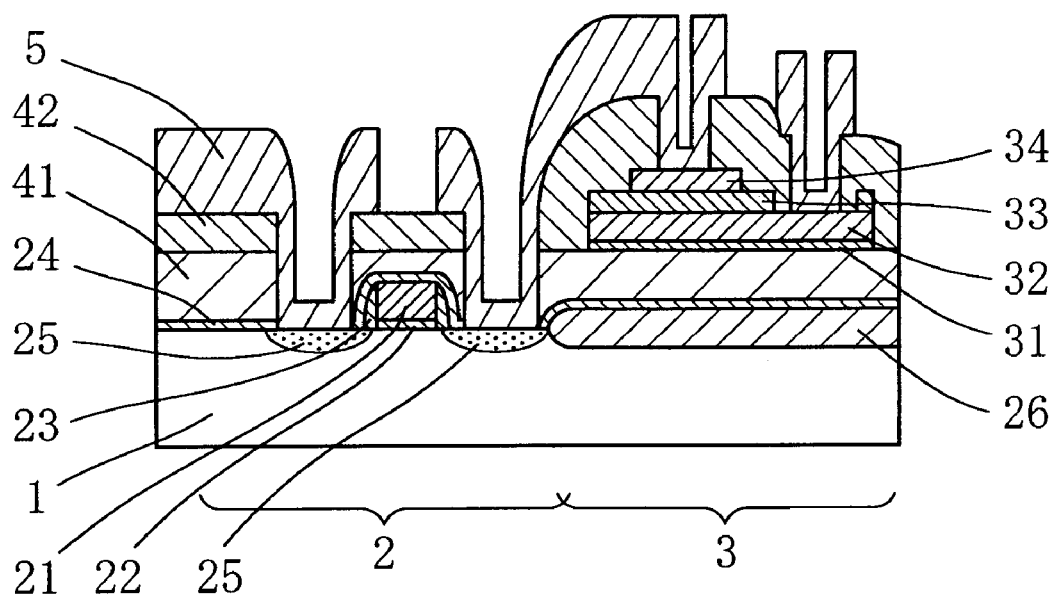

PRIOR ART

PRIOR ART

SEMICONDUCTOR DEVICE INCLUDING ACRYLIC RESIN LAYER

BACKGROUND OF THE INVENTION

The present invention relates to a semiconductor device including a ferroelectric film or a dielectric film with a high dielectric constant (which will be herein referred to as a "high-dielectric-constant film") and to a method for fabricating the device.

Recently, nonvolatile or large-capacity semiconductor memories have been developed using a ferroelectric material or a dielectric material with a high dielectric constant. Each of these dielectric materials is made by sintering a metal oxide and contains a lot of easily reactive oxygen. Accordingly, when a capacitor, including a capacitive insulating film of such a dielectric material, is formed, the upper and lower electrodes of the capacitor, located over and under the capacitive insulating film, respectively, must be made of some material showing sufficient stability against the oxidation. Examples of the applicable materials include an alloy mainly composed of platinum.

A known semiconductor device includes a passivation film on the uppermost surface thereof. The passivation film is deposited over the structure already including a capacitor and an interlevel dielectric film, and is typically made of silicon nitride or silicon dioxide. Normally, the passivation film is formed by a CVD (chemical vapor deposition) process, and often contains hydrogen or moisture therein.

Also, when a semiconductor device and its associated members are molded together with a resin encapsulant by a transfer molding process, for example, the resin encapsulant used for the process often contains some filler (which is usually silica). However, the particles of the filler have a high hardness, thus possibly doing serious damage on the surface of the device during the resin molding process. In addition, in fabricating a DRAM (dynamic random access memory), an α-ray is emitted from the radioactive components of the filler and sometimes causes soft errors in the memory.

Therefore, to prevent the surface of a semiconductor device from being damaged by the filler particles or to shield the device from the α-rays emitted therefrom, the surface is often covered with a coating of some organic material (e.g., polyimide). Also, the surface of a device is sometimes given double protection. Specifically, a passivation film of an inorganic insulator is deposited over the surface first, and then a surface coating of polyimide is formed on the passivation film. The polyimide surface coating is normally formed by heating and curing a film of a polyimide precursor composition at a temperature of about 350–450° C.

Accordingly, a semiconductor device including a ferroelectric or high-dielectric-constant film also needs to have its surface covered with a polyimide coating because of similar reasons. In the current state of the art, however, where a polyimide coating is formed on the surface of a semiconductor device including a capacitive insulating film made of a ferroelectric material, the polarization properties of the ferroelectric film should degrade while the polyimide is heated to form the coating. Therefore, the polyimide coating is hard to apply to the actual fabrication process of such a device. This is because while the polyimide precursor is being heated and cured, hydrogen or moisture, contained in the passivation or interlevel dielectric film of the device, adversely diffuses into the ferroelectric film due to the heat, thus degrading the polarization properties of the ferroelectric film.

The degradation is believed to occur through one of the following mechanisms. One possibility is that platinum, contained in the upper and lower electrodes, may react with hydrogen and act as a catalyst that reduces the material of the ferroelectric film (i.e., an oxide). Another possibility is that the moisture reacts with the material of metal interconnects made of aluminum, for example, to produce hydrogen and thereby degrade the polarization properties of the capacitor (see The Institute of Electronics, Information and Communication Engineers Transactions, C Vol. J83-G No. 1, pp.53–59).

To solve this problem, a countermeasure process was proposed in Japanese Laid-Open Publication No. 10-270611, for example. In the proposed process, a polyimide film is formed as a surface coating for a semiconductor device including a ferroelectric film by heating and curing a film of a polyimide precursor composition at a temperature of 230–300° C. According to this method, the polarization properties of the ferroelectric film do not degrade so much. It should be noted that the same problem might occur in the high-dielectric-constant film as well as in the ferroelectric film.

Hereinafter, a known semiconductor device and a method for fabricating the device will be described with reference to FIGS. 6 through 7C. As an exemplary known semiconductor device, FIG. 6 schematically illustrates a cross-sectional structure for one of the one-transistor, one-capacitor memory cells of a ferroelectric memory.

The semiconductor device shown in FIG. 6 includes an MOS transistor 2 and a ferroelectric capacitor 3 that have been formed over a substrate 1. A surface coating 62 of polyimide has been formed to cover an interconnection layer 5 and a second insulating film 42 that are located over the transistor 2 and capacitor 3.

The MOS transistor 2 shown in FIG. 6 is made up of known components including source/drain regions and a polysilicon gate. In the illustrated example, the MOS transistor 2 includes gate electrode 21 of polysilicon, gate oxide film 22, sidewall 23, silicon nitride film 24, source/drain regions (doped regions) 25 and LOCOS 26.

The ferroelectric capacitor 3 is made up of lower electrode 32, upper electrode 34 and ferroelectric film 33 interposed between these electrodes 32 and 34. If necessary, an electrode contact layer 31 is additionally formed under the lower electrode 32. The ferroelectric film 33 may be made of any arbitrary material such as lead zirconate titanate ($Pb(Zr,Ti)O_3$ (PZT)) or strontium bismuth tantalate ($SrBi_2Ta_2O_9$ (SBT)).

A first insulating film 41 may be a silicon dioxide film or a silicon nitride film. In the former case, the first insulating film 41 may be a BPSG (borophosphosilicate glass), PSG (phosphosilicate glass) or $O_3$-TEOS (tetraethylortho silicate) film, for example. The second insulating film 42 on the first insulating film 41 may be a silicon dioxide film formed by an APCVD (atmospheric-pressure chemical vapor deposition) process, for example. An interconnection layer 5 has been formed on the second insulating layer 42 and electrically connected to the MOS transistor 2 and ferroelectric capacitor 3.

Hereinafter, a method for fabricating the semiconductor device shown in FIG. 6 will be described with reference to FIGS. 7A through 7C. FIGS. 7A through 7C are cross-sectional views illustrating respective process steps for fabricating the known semiconductor device.

First, a semiconductor substrate 1 (which is preferably a wafer in the actual fabrication process) is prepared as shown in FIG. 7A. Next, MOS transistor 2, ferroelectric capacitor 3 and so on are formed by a known process on each active region, and then an interconnection layer 5 is formed thereon as shown in FIG. 7B.

Next, as shown in FIG. 7C, a surface coating 62 of polyimide, having a plurality of openings (not shown) over bonding pad regions, is formed to cover the substrate 1 that already includes the transistor 2, capacitor 3 and interconnection layer 5 thereon.

The surface coating 62 may be formed as follows. First, a photosensitive polyimide material, containing a polyimide precursor composition that will cure when heated to a temperature of 230–300° C., is applied onto the surface of the substrate 1 that already includes the transistor 2, capacitor 3 and interconnection layer 5 thereon. Next, the film of the polyimide precursor composition is exposed to a radiation while being masked with a predetermined pattern. Subsequently, after the non-exposed parts of the film have been dissolved in a developer and removed, the remaining parts of the film are heated and cured at a temperature of 230–300° C. Thereafter, the wafer 1 with the surface-coating 62 is diced into multiple semiconductor chips. Then, each of the chips and its associated members are molded together with a resin encapsulant to obtain a package, which is then subjected to an assembling process to mount the package onto a circuit board.

In this manner, a semiconductor device, including a ferroelectric capacitor and a surface coating of polyimide, is fabricated. In this known technique, the polyimide precursor is heated and cured at 230–300° C., i.e., a temperature much lower than the heat treatment temperature of well over 300° C. at which serious degradation in polarization properties of the ferroelectric film is observed. Thus, this technique can suppress the degradation to a certain degree.

However, the present inventors found out that the known technique can not sufficiently suppress the degradation of the ferroelectric film 33 in the semiconductor device. The ferroelectric film 33 of the known semiconductor device still degrades even though the heat treatment temperature of the polyimide film is much lower than the normal one of about 350–450° C. The reason is probably as follows. Specifically, a film included in the semiconductor device may emit some gas and produce water molecules even at 300° C. or less, thus degrading the ferroelectric film 33.

If the degradation of the ferroelectric film 33 can not be suppressed sufficiently, then each device of a large-capacity or densely integrated circuit is affected by the degradation particularly seriously. In the circuit of that type, the ferroelectric (or high-dielectric-constant) film 33 thereof also has a very small size. Accordingly, when the ferroelectric film 33 degrades, each of the devices (e.g., capacitors) included in the circuit is affected by the degradation much more greatly. For that reason, the semiconductor device as a whole also has its performance deteriorated seriously by the degradation of the ferroelectric film 33. For example, suppose the semiconductor device is a memory with a storage capacity of several megabits. In that case, should some memory cells, representing just several bits, fail due to the degradation caused by any variation in the fabrication process thereof, the yield of the semiconductor devices decreases considerably, thus making it difficult to manufacture the devices stably enough.

SUMMARY OF THE INVENTION

It is therefore an object of the present invention to provide (1) a highly reliable semiconductor device, including a ferroelectric or high-dielectric-constant film, without degrading its performance and (2) a method for fabricating a device of that type.

A semiconductor device according to the present invention includes at least a ferroelectric or high-dielectric-constant film and a surface coating that have been stacked in this order over a substrate. In this device, the surface coating is made of an acrylic resin.

Another semiconductor device according to the present invention includes at least a ferroelectric or high-dielectric-constant film and a surface coating that have been stacked in this order over a substrate. In this device, the surface coating is made up of multiple layers, at least one of which is made of an acrylic resin.

In one embodiment of the present invention, the ferroelectric or high-dielectric-constant film may be a capacitive insulating film for a capacitor.

Still another semiconductor device according to the present invention includes: a capacitor including a ferroelectric or high-dielectric-constant film as a capacitive insulating film; an insulating film that covers the capacitor; and a surface coating that covers the insulating film. In this device, the surface coating is made of an acrylic resin.

An inventive method for fabricating a semiconductor device includes the steps of: forming a ferroelectric or high-dielectric-constant film over a substrate; depositing an acrylic resin over the substrate to cover the ferroelectric or high-dielectric-constant film with the acrylic resin; and heating and curing the acrylic resin.

Another inventive method for fabricating a semiconductor device includes the steps of: forming a capacitor, which includes a ferroelectric or high-dielectric-constant film as a capacitive insulating film, over a substrate; depositing an acrylic resin over the substrate to cover the capacitor with the acrylic resin; and heating and curing the acrylic resin.

Still another inventive method for fabricating a semiconductor device includes the steps of: forming a capacitor, which includes a ferroelectric or high-dielectric-constant film as a capacitive insulating film, over a substrate; forming an insulating film over the substrate to cover the capacitor with the insulating film; depositing an acrylic resin over the insulating film; and heating and curing the acrylic resin.

In one embodiment of the present invention, the step of heating and curing the acrylic resin may include heating the acrylic resin to a temperature of 250° C. or less.

In this particular embodiment, the acrylic resin is preferably heated by a hot plate.

According to the present invention, the surface coating is made of an acrylic resin, which can be heated and cured at a lower temperature than a polyimide resin as a material for the known surface coating. Thus, even in the heat, it is still possible to minimize the unwanted diffusion of hydrogen or moisture from some film of the semiconductor device into the ferroelectric or high-dielectric-constant film thereof. As a result, it is possible to suppress the degradation in performance of the semiconductor device. Also, according to the present invention, a hot plate is used to heat and cure the acrylic resin. Thus, the acrylic resin can be heated and cured in a shorter time than any other heat treatment using some furnace such as an oven or diffusion furnace.

BRIEF DESCRIPTION OF THE DRAWINGS

FIGS. 5A through 5D are cross-sectional views illustrating respective process steps for fabricating the semiconductor device of the second embodiment.

DESCRIPTION OF THE PREFERRED EMBODIMENTS

Figure 1:
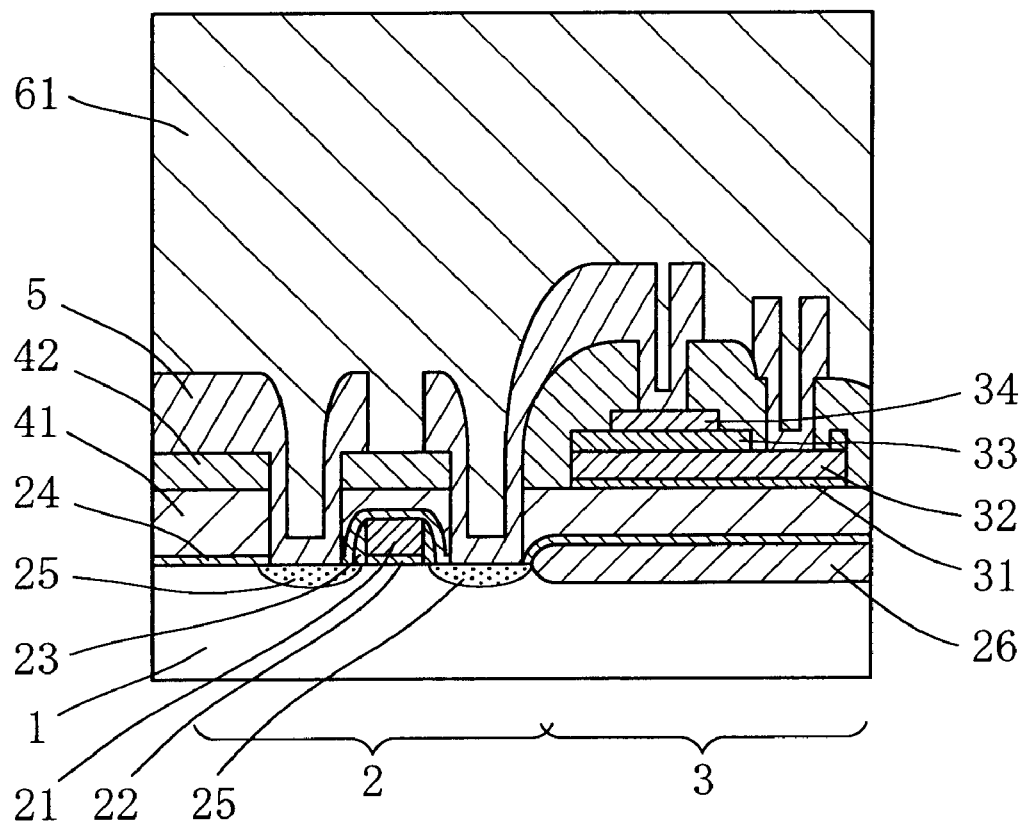
FIG. 1 is a cross-sectional view schematically illustrating a semiconductor device according to a first embodiment of the present invention.

To suppress the degradation in polarization properties of the ferroelectric film due to the diffusion of hydrogen or moisture from the surface coating being heated and cured into the ferroelectric film, we carried out an intensive research for finding a surface coating that can be formed at a lower temperature. The results are as follows. In the prior art, where an organic film should be formed as a surface coating for a semiconductor device, a polyimide film with good heat resistance is normally used. This is because the surface coating of a semiconductor device needs to show good resistibility to any heat treatment (e.g., solder reflow) required for the fabrication process thereof. Recently, however, various types of low-temperature process techniques have been developed remarkably. In addition, a technique of establishing electrical connection using a tape, not solder, i.e., a technique not requiring the solder reflow process step, is also readily available. Under the circumstances such as these, a semiconductor device can now much more likely be fabricated even without using a film with good heat resistance. Thus, the present inventors decided to use an acrylic resin film, of which the curing temperature is lower than that of a polyimide film, as a surface coating.

The curing temperature of an acrylic resin is about 250° C. or less, and a number of acrylic resins with curing temperatures ranging from 200 to 230° C. have been developed. Accordingly, it is possible to form a surface coating by heating and curing an acrylic resin at a lower temperature than the polyimide resin. Thus, the degradation in performance of a semiconductor device, which would otherwise be caused in the heat by the unwanted diffusion of hydrogen or moisture from some film of the device into the ferroelectric or high-dielectric-constant film thereof, can be suppressed.

Hereinafter, preferred embodiments of the present invention will be described with reference to the accompanying drawings, in which components having substantially the same functions will be identified by the same reference numeral for the sake of simplicity. It should be noted that the present invention is not limited to the following specific embodiments.

Embodiment 1

A semiconductor device according to a first embodiment of the present invention will be described with reference to FIGS. 1 through 3C. The semiconductor device of the first embodiment is implemented as a ferroelectric memory including a plurality of one-transistor, one-capacitor memory cells.

FIG. 1 schematically illustrates a cross-sectional structure of one of the memory cells included in the device of the first embodiment. The device shown in FIG. 1 includes an MOS transistor 2 and a ferroelectric capacitor 3 that have been formed over a substrate 1.

As shown in FIG. 1, a surface coating 61 of an acrylic resin has been formed to cover an interconnection layer 5 and a second insulating film 42. The interconnection layer 5 is electrically connected to the MOS transistor 2 and ferroelectric capacitor 3. The second insulating film 42 covers a first insulating film 41, which has been formed over the substrate 1. The acrylic resin may be a polymer or copolymer of acrylic acid, methacrylic acid or an ester thereof and herein includes methyl polymethacrylate. The acrylic resin may be cured at about 250° C. or less, preferably about 200–230° C. In this embodiment, PC335 or PC403, which is produced by JSR (formerly known as Japan Synthetic Rubber Co., Ltd.) and can be cured at 220° C., was used as the acrylic resin.

The MOS transistor 2 is made up of known components including source/drain regions 25 and a polysilicon gate 21. In the embodiment illustrated in FIG. 1, the MOS transistor 2 includes gate electrode 21 of polysilicon, gate oxide film 22, sidewall 23, silicon nitride film 24, source/drain regions (doped regions) 25 and LOCOS 26.

The ferroelectric capacitor 3 is made up of lower electrode 32, upper electrode 34 and ferroelectric film 33 interposed between these electrodes 32 and 34. The lower and upper electrodes 32 and 34 may be made of: a metal selected from the group consisting of platinum (Pt), gold (Au), iridium (Ir), ruthenium (Ru), rhodium (Rh) and palladium (Pd); or a conductive metal oxide such as iridium oxide (IrO$_2$) or ruthenium oxide (RuO$_2$). If necessary, an electrode contact layer 31, made of one of these metals or metal oxides and titanium (Ti) or titanium nitride (TiN), may be formed under the lower electrode 32. Thus, the ferroelectric capacitor 3 has a multilayer structure like this.

The ferroelectric film 33 may be made of any arbitrary material such as lead zirconate titanate (Pb(Zr, Ti)O$_3$ (PZT)) or strontium bismuth tantalate (SrBi$_2$Ta$_2$O$_9$ (SBT)).

The first insulating film 41 may be a silicon dioxide film or a silicon nitride film. In the former case, the first insulating film 41 may be a BPSG (borophosphosilicate glass), PSG (phosphosilicate glass) or O$_3$-TEOS (tetraethylortho silicate) film, for example. In the illustrated embodiment, the first insulating film 41 has been formed on the silicon nitride film 24. The second insulating film 42 on the first insulating film 41 may be a silicon dioxide film formed by an APCVD process, for example.

The interconnection layer 5 has been formed on the second insulating layer 42 and electrically connected to the MOS transistor 2 and ferroelectric capacitor 3. The interconnection layer 5 may be made of: aluminum (Al), copper (Cu), tungsten (W), titanium (Ti) or silicon (Si); a compound thereof; or a multilayer structure of these materials in any arbitrary combination.

Figure 2A:
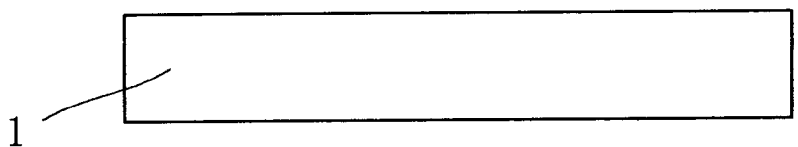
FIGS. 2A through 2C are cross-sectional views illustrating respective process steps for fabricating the semiconductor device of the first embodiment.
Figure 2B:
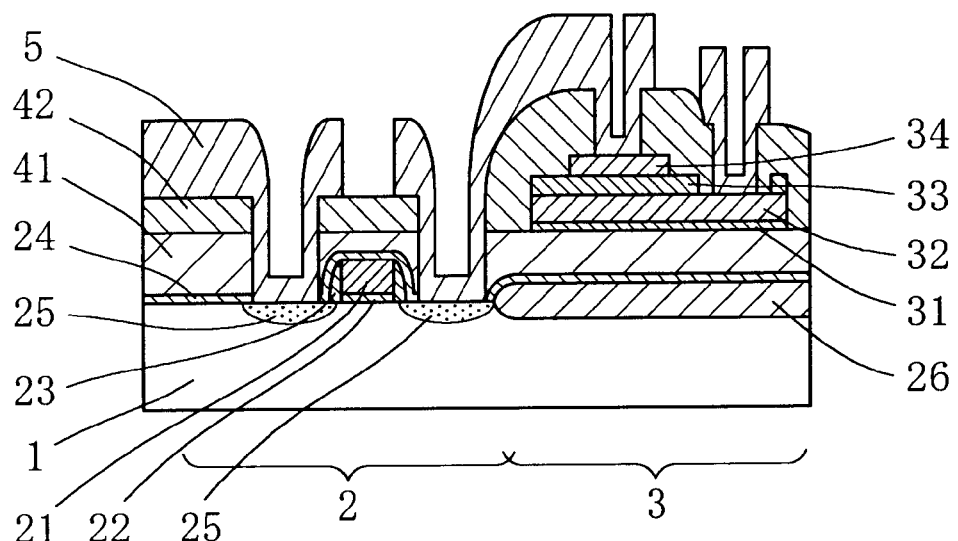
Figure 2C:
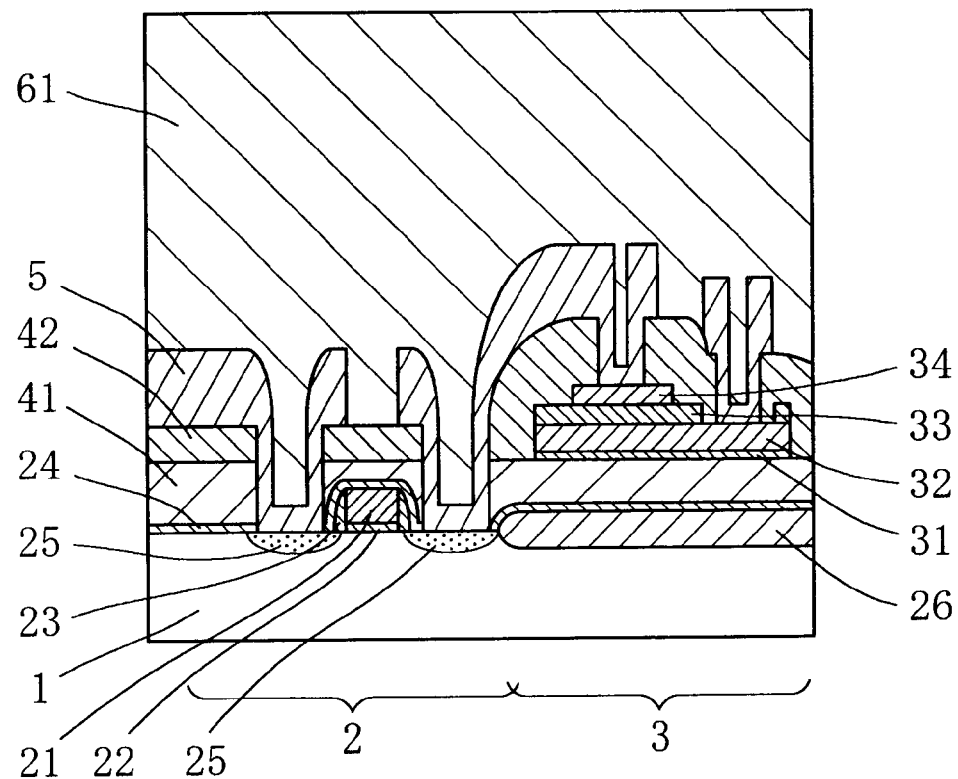

Next, a method for fabricating the semiconductor device shown in FIG. 1 will be described with reference to FIGS. 2A through 2C. FIGS. 2A through 2C are cross-sectional views illustrating respective process steps for fabricating the device of the first embodiment.

First, a semiconductor substrate 1 is prepared as shown in FIG. 2A. In a preferred embodiment, the substrate 1 may be a silicon wafer. However, the substrate 1 does not have to be made of a semiconductor entirely, but has only to include a semiconductor region in the uppermost part thereof. Accordingly, an SOI substrate may also be used as the substrate 1. It should be noted that even if one or multiple layers or elements have already been formed on the substrate 1, the substrate 1 with those members will also be referred to as a "substrate" for the sake of convenience.

Next, MOS transistor 2, ferroelectric capacitor 3 and so on are formed by a known process on each active region, and then an interconnection layer 5 is formed thereon as shown in FIG. 2B.

Thereafter, as shown in FIG. 2C, a surface coating 61 of an acrylic resin is formed to cover the substrate 1 that already includes the transistor 2, capacitor 3 and interconnection layer 5 thereon. The coating 61 has a plurality of openings (not shown) over predetermined regions, e.g., bonding pad regions. In this embodiment, the substrate is spin-coated with a photosensitive acrylic resin. Then, the acrylic resin applied is partially exposed to a radiation through a mask on which a predetermined pattern has been defined. Next, non-exposed parts of the resin are dissolved in a developer and removed, thereby forming the openings over the bonding pad regions. A photosensitive composition is used as an acrylic resin for this embodiment. This is because an acrylic resin film having a desired pattern can be obtained easily by exposing a film of the composition to a radiation through a mask with a predetermined pattern, dissolving and removing non-exposed parts thereof using a developer and then heating and curing remaining parts thereof.

Subsequently, after the substrate has been cleaned with a dedicated rinse and washed with water, the resin is heated in the air to 220° C. for eight minutes by a hot plate heater so as to be cured. As a result, an acrylic resin surface coating 61 having openings over the bonding pad regions is obtained. In this embodiment, the resultant acrylic resin film has a thickness of 3.0 µm. Thereafter, known assembling process steps are carried out to complete a semiconductor device.

Hereinafter, the polarization properties of the ferroelectric film 33 in the semiconductor device of the first embodiment will be described with reference to FIGS. 3A through 3C.

Figure 3A:
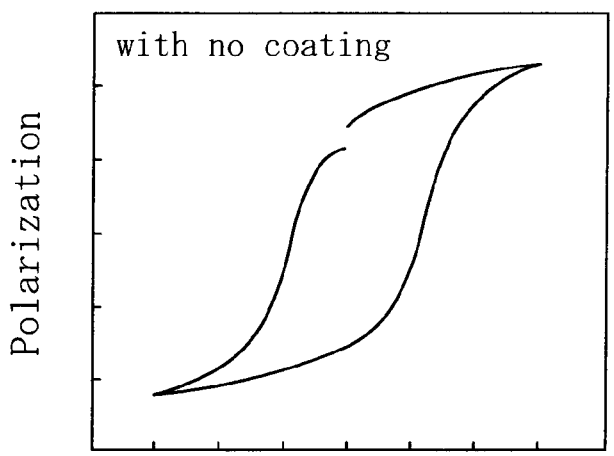
FIGS. 3A through 3C are graphs illustrating the polarization properties of the ferroelectric films 33 of mutually different materials.
Figure 6:
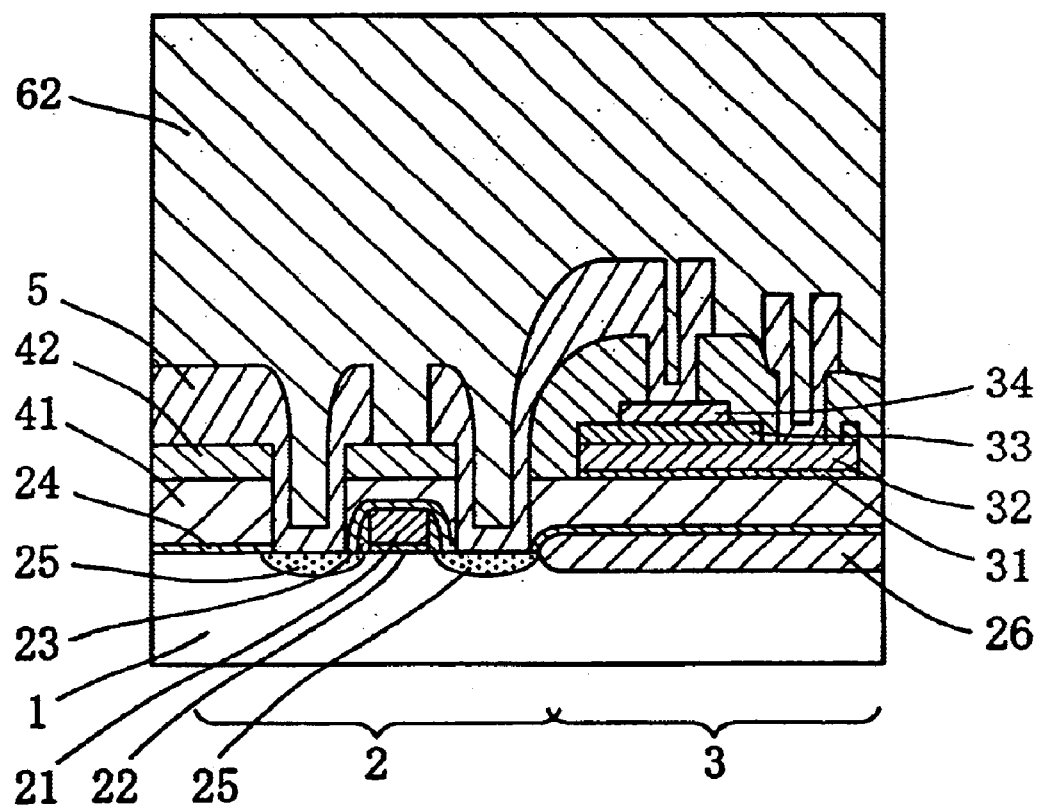
FIG. 6 is a cross-sectional view schematically illustrating a known semiconductor device.
Figure 7A:
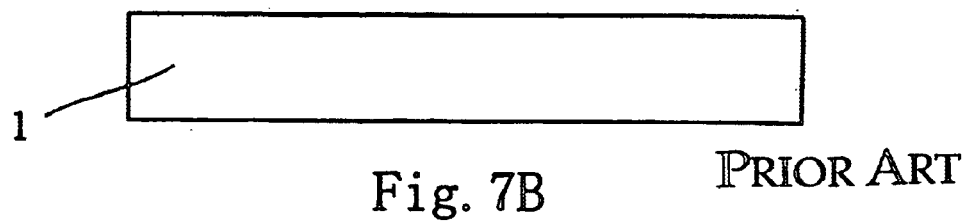
FIGS. 7A through 7C are cross-sectional views illustrating respective process steps for fabricating the known semiconductor device shown in FIG. 6.
Figure 7B:
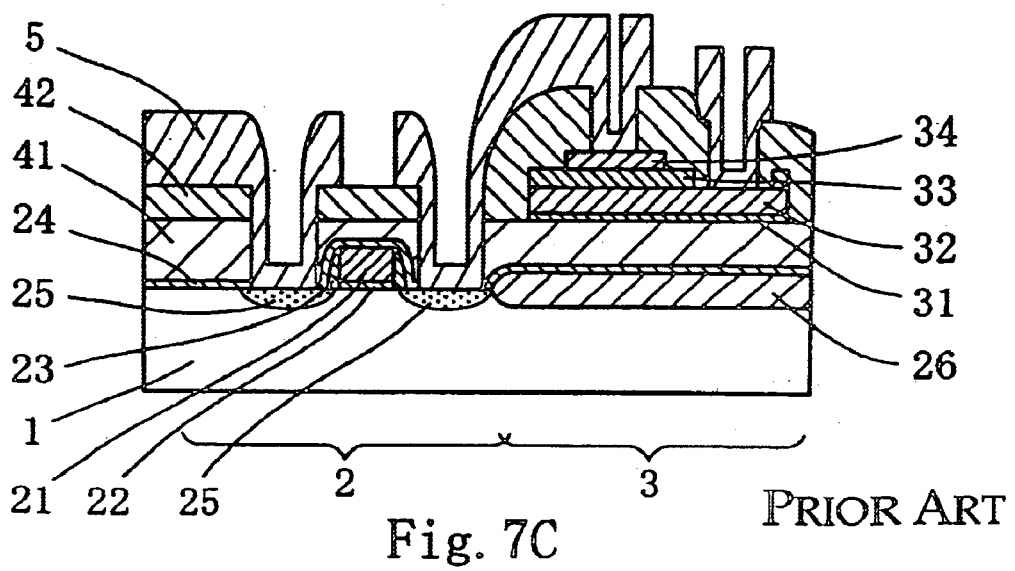
Figure 7C:
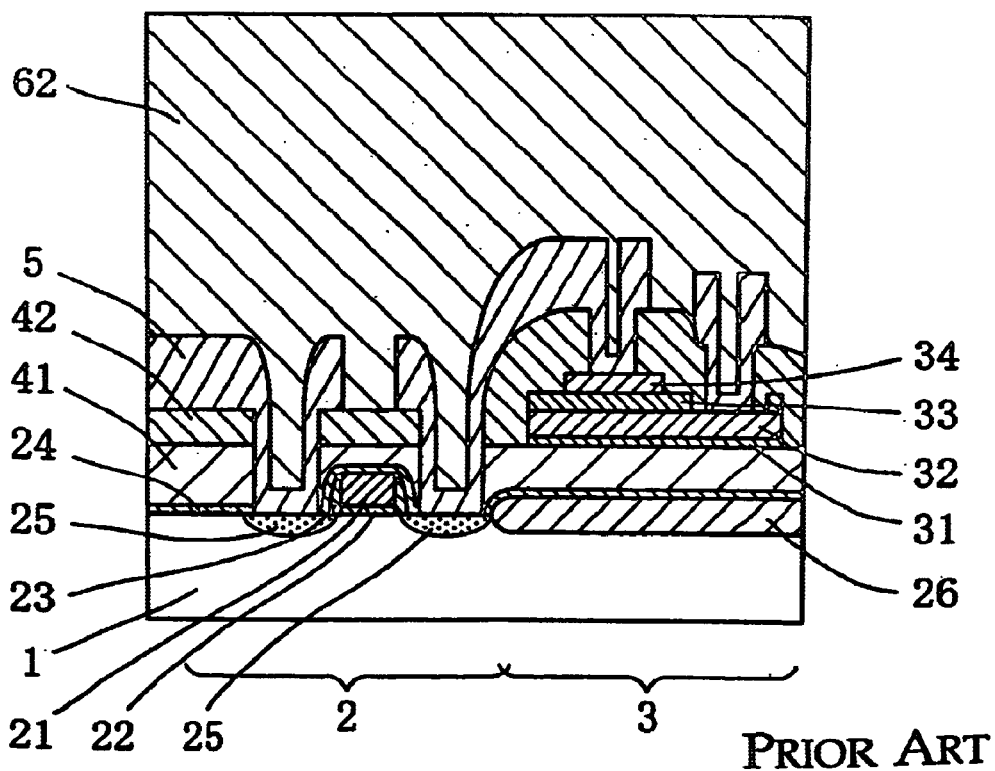

FIG. 3A is a graph illustrating the polarization properties of the ferroelectric film 33 just after the interconnection layer 5 has been formed (i.e., when the structure having no surface coating yet is completed as shown in FIG. 2B). FIG. 3B is a graph illustrating the polarization properties of the ferroelectric film 33 where the surface coating 61 shown in FIG. 1 is made of an acrylic resin (i.e., this embodiment). FIG. 3C is a graph illustrating the polarization properties of the ferroelectric film 33 where the surface coating 62 shown in FIG. 6 is made of polyimide (i.e., a compare example).

More specifically, FIG. 3A illustrates the polarization properties of a sample on which the following process steps have been performed. First, after the capacitor 3 has been formed over the first insulating film 41, an interlevel dielectric film of SiO$_2$ is deposited thereon as the second insulating film 42 by an APCVD process. Next, the interconnection layer 5 is formed on the second insulating film 42 by a known process so as to make an electrical contact with the upper and lower electrodes 34 and 32. Thereafter, the ferroelectric film 33 is annealed to repair the damage done on the film 33. The hysteresis curve shown in FIG. 3A was obtained by generating various voltages between the upper and lower electrodes 34 and 32 of the ferroelectric capacitor 3 with a probe placed on the sample. That is to say, the hysteresis curve shown in FIG. 3A shows a relationship between the polarization of the ferroelectric capacitor 3 and the applied voltage. We used this hysteresis curve shown in FIG. 3A as reference data.

Figure 3B:
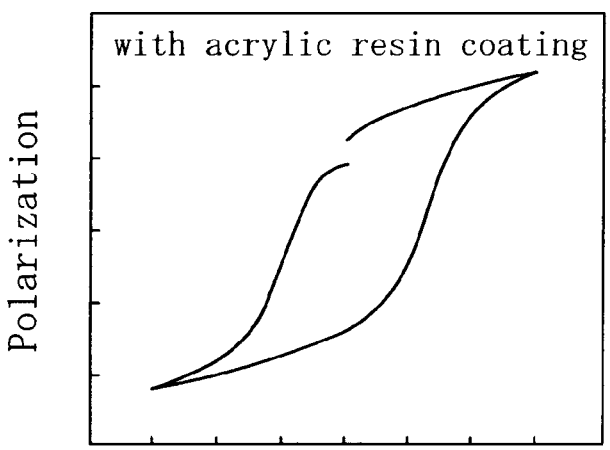
Figure 3C:
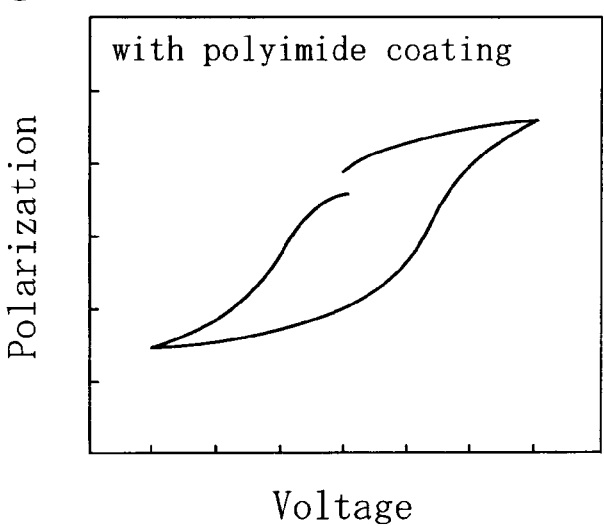

FIGS. 3B and 3C illustrate the hysteresis curves obtained for two other samples, both of which had almost the same structure as the sample with the hysteresis shown in FIG. 3A but the surface coating 61 of an acrylic resin or polyimide deposited to a thickness of 3 µm. More specifically, the sample with the hysteresis shown in FIG. 3B was formed by coating the structure with a photosensitive acrylic resin, performing a photolithographic process thereon and then baking and curing the resin at 220° C. for ten minutes using a hot plate. On the other hand, the sample with the hysteresis shown in FIG. 3C was formed by coating the structure with a photosensitive polyimide, performing a photolithographic process thereon and then baking and curing the polyimide at 300° C. for ten minutes using a hot plate.

As can be seen from FIGS. 3A through 3C, the hysteresis curve shown in FIG. 3B for the ferroelectric capacitor 3 coated with the acrylic resin was almost the same as the reference data shown in FIG. 3A. That is to say, no degradation was observed in the polarization properties of the ferroelectric film 33. As for the ferroelectric capacitor 3 coated with polyimide, however, the hysteresis curve thereof narrowed vertically and the polarizability thereof decreased as can be seen from FIG. 3C. In other words, non-negligible degradation was observed in the polarization properties of the ferroelectric film 33. It should be noted that the polarization and voltage shown in FIGS. 3A through 3C may be represented on arbitrary scales.

In the first embodiment, the surface coating 61 is made of an acrylic resin, and can be formed at a lower temperature than the known surface coating of polyimide. Accordingly, even in the heat, it is still possible to suppress the diffusion of hydrogen or moisture from some film (e.g., the interlevel dielectric film 42) of the semiconductor device into the ferroelectric film 33. As a result, the degradation in polarization properties of the ferroelectric film 33 can be suppressed, thus realizing a semiconductor device with excellent performance. Moreover, the number of defects can also be reduced greatly. Consequently, the yield can be increased and the fabrication cost can be cut down.

Embodiment 2

Figure 4:
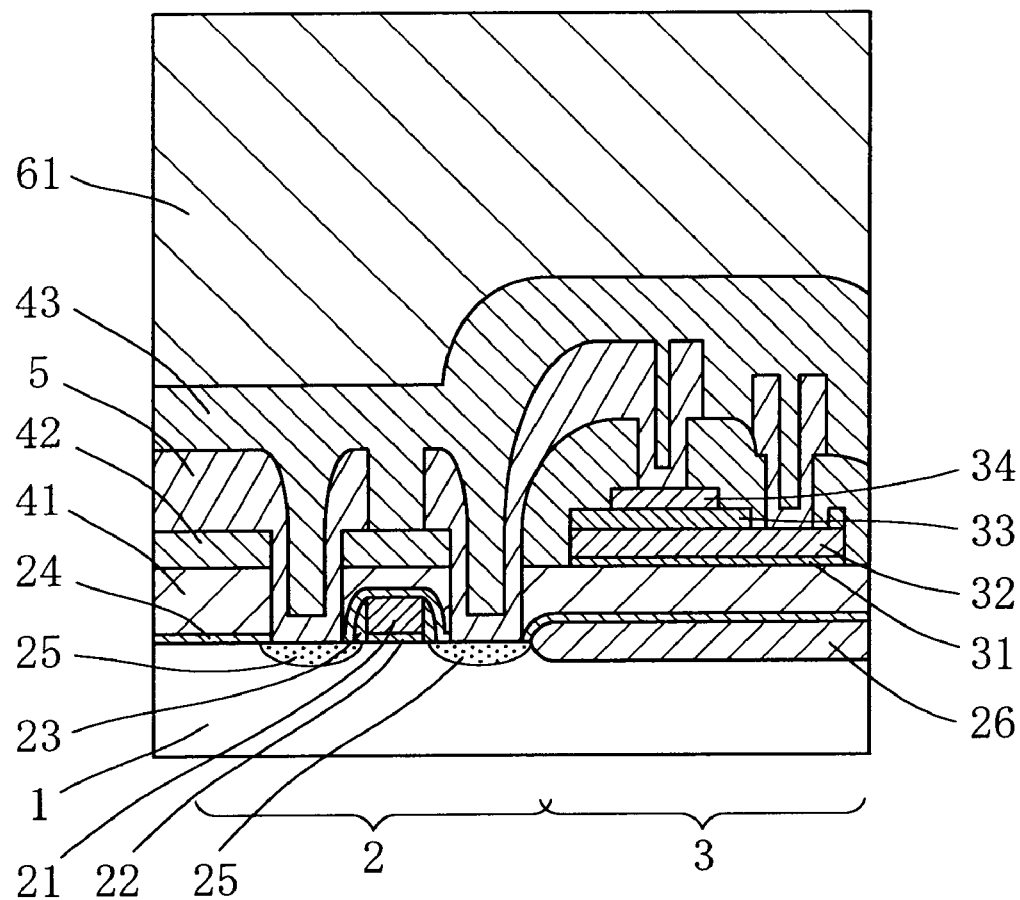
FIG. 4 is a cross-sectional view schematically illustrating a semiconductor device according to a second embodiment of the present invention.

Hereinafter, a second embodiment of the present invention will be described with reference to FIGS. 4 through 6. FIG. 4 schematically illustrates a cross-sectional structure of one of the memory cells included in a semiconductor device according to the second embodiment.

The device of the second embodiment is different from the device of the first embodiment in that a third insulating film 43 has been formed under the surface coating 61. Specifically, in the device of the second embodiment, the third insulating film 43 has been formed to cover the capacitor 3 (and the transistor 2) with the second insulating film 42 and the interconnection layer 5 interposed therebetween. And the surface coating 61 of an acrylic resin has been formed on the third insulating film 43. In the illustrated embodiment, the third insulating film 43 may be a silicon nitride film, for example.

In the second embodiment, the surface coating 61 of an acrylic resin covers the third insulating film, which is a normal coating made of silicon nitride, for example. Accordingly, the structure of the second embodiment can minimize the damage, possibly done on the capacitors 3 and transistors 2 during the assembling process steps, as well as, or even better than, a semiconductor device with a normal structure. Thus, according to the second embodiment, not just the degradation in performance of the semiconductor device is suppressible, but also the reliability thereof is improvable as well. In the other respects, the structure of the second embodiment is totally the same as that of the first embodiment, and the description thereof will be omitted herein.

Hereinafter, a method for fabricating the semiconductor device shown in FIG. 4 will be described with reference to FIGS. 5A through 5D. FIGS. 5A through 5D are cross-sectional views illustrating respective process steps for fabricating a semiconductor device according to the second embodiment.

First, a semiconductor substrate 1 (which may be a silicon wafer in a preferred embodiment) is prepared as shown in FIG. 5A. Next, MOS transistor 2, ferroelectric capacitor 3 and so on are formed by a known process on each active region, and then an interconnection layer 5 is formed thereon as shown in FIG. 5B.

Figure 5C:
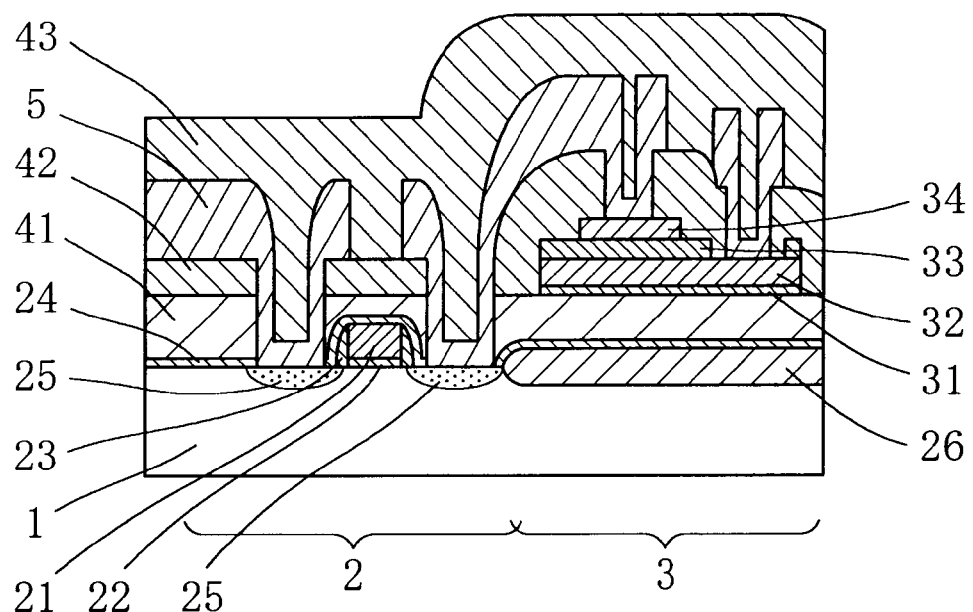

Subsequently, as shown in FIG. 5C, a third insulating film 43 of silicon nitride is deposited over the substrate by a known process (e.g., a CVD process). Then, openings (not shown) are formed through parts of the third insulating film 43 over predetermined regions (e.g., bonding pad regions) by known processes including photolithographic and etching processes.

Figure 5D:
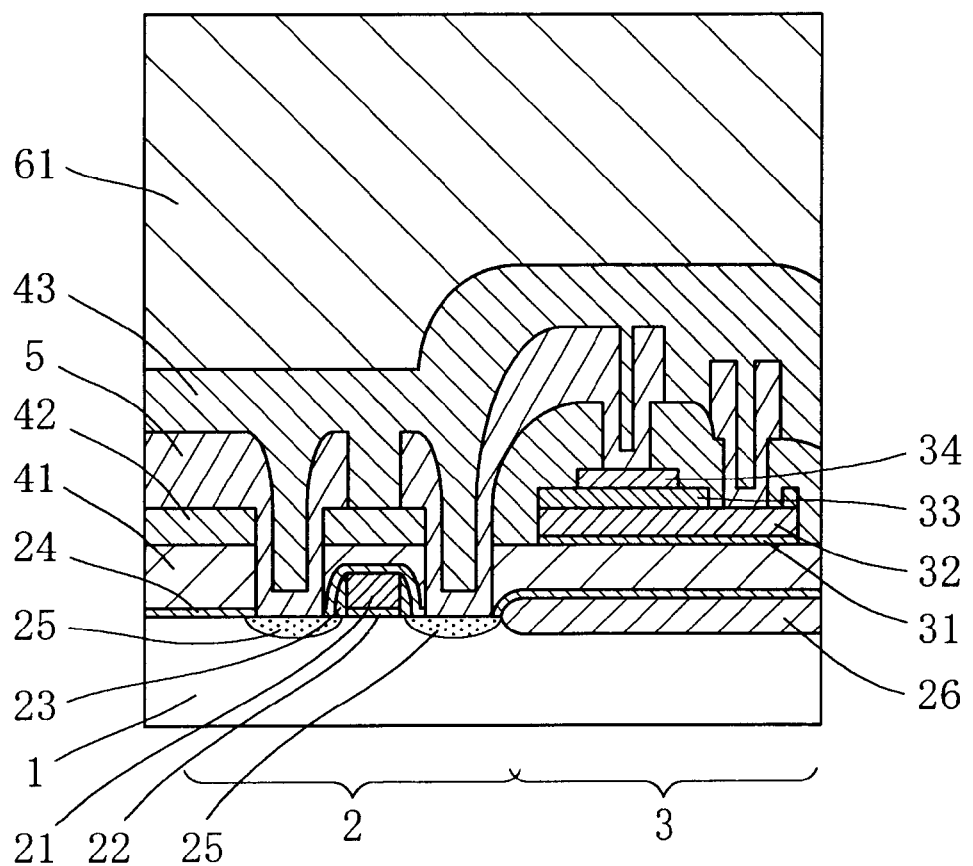

Thereafter, as shown in FIG. 5D, a surface coating 61 of an acrylic resin is deposited over the substrate 1 that has been covered with the third insulating film 43 on the surface thereof. The coating 61 has a plurality of openings (not shown) over predetermined regions, e.g., bonding pad regions.

In this embodiment, the substrate is spin-coated with a photosensitive acrylic resin. Then, the acrylic resin applied is partially exposed to a radiation through a mask on which a predetermined pattern has been defined. Next, non-exposed parts of the resin are dissolved in a developer and removed, thereby forming the openings over the bonding pad regions.

Subsequently, after the substrate has been cleaned with a dedicated rinse and washed with water, the resin is heated in the air to 220° C. for eight minutes by a hot plate heater so as to be cured. As a result, an acrylic resin surface coating 61 having openings over the bonding pad regions is obtained. In this embodiment, the resultant acrylic resin film has a thickness of 3.0 $\mu$m. Thereafter, known assembling process steps are carried out to complete a semiconductor device.

This fabrication process may be modified in the following manner.

Specifically, after the process steps shown in FIGS. 5A and 5B have been performed, a third insulating film 43 of silicon nitride is deposited by a known process such as a CVD process. In this alternative process, however, no openings are formed at this time over the bonding pad regions unlike the process exemplified above.

Subsequently, the substrate is spin-coated with a photosensitive acrylic resin. Then, the acrylic resin applied is partially exposed to a radiation through a mask on which a predetermined pattern has been defined. Next, non-exposed parts of the resin are dissolved in a developer and removed, thereby forming openings (not shown) over the bonding pad regions. Next, as in the foregoing process, the substrate is cleaned and then the resin is heated and cured.

Thereafter, using the acrylic resin film 61 as a mask, parts of the silicon nitride film 43, covering the bonding pad regions under the openings of the resin film 61, are dry-etched away with a mixture of 94% $CF_4$ and 6% $O_2$ gases so that the metal electrodes are exposed in the bonding pad regions.

In this manner, a semiconductor device, including a ferroelectric capacitor covered with the acrylic resin surface coating 61, and its fabrication process are realized. In any of the foregoing embodiments, the heat treatment can be conducted at a temperature even lower than the curing temperature of polyimide, i.e., 230 to 300° C., for use in the known process. As a result, the degradation in polarization properties of the ferroelectric films can be suppressed much more satisfactorily.

As described above, the curing temperature of an acrylic resin is 250° C. or less. Accordingly, in the semiconductor device of this embodiment, the ferroelectric film should have its polarization properties degraded only slightly if any. In addition, most acrylic resins are actually cured at temperatures from 200° C. to 230° C., and the actual heat treatment can almost always be carried out at a temperature lower than that required for the known heat treatment. The heat curing process can be conducted at that low temperature. Thus, the degradation in performance of a semiconductor device, which should otherwise be caused by the diffusion of hydrogen or moisture from some film of the device (e.g., an interlevel dielectric film) in the heat, can be minimized.

Furthermore, even if the heat treatment should be carried out at a temperature higher than 250° C., the degradation in polarization properties of the ferroelectric film (and eventually the performance of the device) is still suppressible effectively enough by performing the treatment at no higher than 300° C. for just a short time. The heat treatment time is changeable depending on the type of a semiconductor device to be fabricated, but is normally one minute or less. These effects are achievable not just for a ferroelectric film but also for a high-dielectric-constant film as well. It should be noted that a transparent acrylic resin might be denatured and partially lose its transparency (or get cloudy) depending upon the curing temperature thereof. In this embodiment, however, the acrylic resin is not used as a material for an optical member but as a material for a surface coating. Therefore, even the loss of transparency from the resin does not cause serious problems.

Furthermore, this embodiment uses a hot plate with a small-sized heat source as a means for heating and curing the acrylic resin film. Therefore, compared to known ones, the money to be invested in the manufacturing equipment and the overall production cost can be reduced advantageously. In addition, the hot plate can heat and cure the resin in a short time than a furnace (e.g., an oven or diffusion furnace), thus reducing the total amount of heat required. As a result, the degradation in characteristics of circuit components, which might be a serious one depending on the amount of heat generated during a post baking process, can be minimized.

Examples of semiconductor devices to which the present invention is applicable include nonvolatile semiconductor memories and DRAMs with a huge storage capacity. The dielectric film of the inventive semiconductor device may be a film of a dielectric material of the type exhibiting ferroelectric properties or having a high dielectric constant. For example, the dielectric film may be a film of a ferroelectric material having a perovskite crystal structure. Examples of the dielectric materials include lead zirconate titanate (Pb(Zr, Ti)$O_3$ (PZT)), barium strontium titanate ((Ba, Sr)Ti$O_3$ (BST)) and niobium strontium bismuth tantalate (SrBi$_2$(Nb, Ta)$_2$O$_9$ (SBT)). A film of any of these materials can be formed by a CVD, sol-gel or sputtering process.

According to the present invention, the surface coating is made of an acrylic resin, which can be heated and cured at a relatively low temperature. Thus, even in the heat, it is still possible to minimize the unwanted diffusion of hydrogen or moisture from some film of the semiconductor device into the ferroelectric or high-dielectric-constant film thereof. As a result, the degradation in performance of the semiconductor device, including the ferroelectric or high-dielectric-constant film, is suppressible.

What is claimed is:
1. A semiconductor device comprising:
   at least a ferroelectric or high-dielectric-constant film and
   a surface coating that has been stacked in this order over a substrate,
   wherein the surface coating is made of an acrylic resin which prevents degradation of polarization properties of the ferroelectric or high-dielectric-constant film on the semiconductor device.
2. The device of claim 1, wherein the ferroelectric or high-dielectric-constant film is a capacitive insulating film for a capacitor.
3. The device of claim 1, wherein the acrylic resin is made of a polymer or copolymer of acrylic acid or methacrylic acid.
4. The device of claim 1, wherein the curing temperature of the acrylic resin is between 200° C. and 230° C.
5. The device of claim 1, wherein the ferroelectric or high-dielectric-constant film is made of lead zirconate titanate (PZT), barium strontium titanate (BST) or strontium bismuth tantalate (SBT).
6. The device of claim 1, wherein the ferroelectric or high-dielectric-constant film is made of a ferroelectric material having a perovskite crystal structure.
7. The device of claim 1, wherein the device is a nonvolatile semiconductor memory or DRAM.
8. A semiconductor device comprising:
   at least a ferroelectric or high-dielectric-constant film and
   a surface coating that has been stacked in this order over a substrate, vwherein the surface coating is made up of multiple layers and at least one of the multiple layers is made of an acrylic resin which prevents degradation of polarization properties of the ferroelectric or high-dielectric-constant film on the semiconductor device.
9. The device of claim 8, wherein the ferroelectric or high dielectric-constant film is a capacitive insulating film for a capacitor.
10. A semiconductor device comprising:
    a capacitor including a ferroelectric or high-dielectric-constant film as a capacitive insulating film;
    an insulating film that covers the capacitor; and
    a surface coating that covers the insulating film,
    wherein the surface coating is made of an acrylic resin which prevents degradation of polarization properties of the ferroelectric or high-dielectric-constant film on the semiconductor device.
11. A semiconductor device comprising:
    a transistor; and
    a capacitor having a capacitive insulating film make of a ferroelectric or high-dielectric-constant material, and electrically connected to the transistor,
    wherein a surface coating is formed on the capacitor, and the surface coating is made of an acrylic resin which prevents degradation of polarization properties of the ferroelectric or high-dielectric-constant film on the semiconductor device.
12. A semiconductor device comprising:
    at least a ferroelectric or high-dielectric-constant film and
    a surface coating that has been stacked in this order over a substrate,
    wherein the surface coating is made of a resin which prevents degradation of polarization properties of the ferroelectric or high-dielectric-constant film on the semiconductor device.

13. The device of claim 12, wherein the resin is cured at 250° C. or less.

14. A semiconductor device comprising:

a transistor; and a capacitor having a capacitive insulating film make of a ferroelectric or high-dielectric-constant material, and electrically connected to the transistor, wherein a surface coating is formed on the capacitor, and the surface coating is made of a resin which prevents degradation of polarization properties of the ferroelectric or high-dielectric-constant film on the semiconductor device.

15. The device of claim 14, wherein the resin is cured at 250° C. or less.

* * * * *